(12) United States Patent
Wang et al.

(10) Patent No.: US 9,966,444 B2
(45) Date of Patent: May 8, 2018

(54) THIN FILM TRANSISTOR, DISPLAY PANEL AND DISPLAY APPARATUS

(71) Applicants: BOE TECHNOLOGY GROUP CO., LTD., Beijing (CN); CHONGQING BOE OPTOELECTRONICS TECHNOLOGY CO.,LTD., Chongqing (CN)

(72) Inventors: Wu Wang, Beijing (CN); Haijun Qiu, Beijing (CN); Fei Shang, Beijing (CN); Guolei Wang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

(*) Notice: Subject to any disclaimer, the term of this patent is extended or adjusted under 35 U.S.C. 154(b) by 0 days. days.

(21) Appl. No.: 14/801,445

(22) Filed: Jul. 16, 2015

(65) Prior Publication Data

US 2016/0118467 A1 Apr. 28, 2016

(30) Foreign Application Priority Data

Oct. 27, 2014 (CN) .......................... 2014 1 0606296

(51) Int. Cl.
*H01L 29/417* (2006.01)
*G02F 1/1362* (2006.01)
(Continued)

(52) U.S. Cl.
CPC ...... *H01L 29/41733* (2013.01); *G02F 1/1362* (2013.01); *H01L 29/786* (2013.01)

(58) Field of Classification Search
CPC ......... H01L 29/41725; H01L 29/78618; H01L 29/41733; H01L 29/0847
See application file for complete search history.

(56) References Cited

U.S. PATENT DOCUMENTS 5,847,413 A * 12/1998 Yamazaki ............ G09G 3/3688
257/347
6,545,291 B1 * 4/2003 Amundson ......... H01L 51/0021
257/20
(Continued)

FOREIGN PATENT DOCUMENTS

CN 1536418 A 10/2004
CN 101315950 A 12/2008
(Continued)

OTHER PUBLICATIONS

Second Chinese Office Action regarding Application No. 201410606296.1 dated Nov. 8, 2016. English translation provided by Dragon Intellectual Property Law Firm.
(Continued)

*Primary Examiner* — Su C Kim
*Assistant Examiner* — David S Wilbert
(74) *Attorney, Agent, or Firm* — Harness, Dickey & Pierce, P.L.C.

(57) ABSTRACT

Disclosed is a thin film transistor, including a gate electrode, a source electrode and a drain electrode. The source electrode includes a loop structure with an opening, and a width of the opening is less than a maximum width of an inner ring of the loop structure of the source electrode in a direction identical to a direction of the width of the opening. The drain electrode is surrounded by the loop structure, and is not in contact with the source electrode. The drain electrode is distant from the inner ring of the loop structure of the source electrode at a same interval.

7 Claims, 3 Drawing Sheets

(51) Int. Cl.
*H01L 29/786* (2006.01)
*G02F 1/1368* (2006.01)

(56) References Cited

U.S. PATENT DOCUMENTS

| | | | | |
|---|---|---|---|---|
| 2007/0254429 A1* | 11/2007 | Cho | ............... | H01L 51/0545 |
| | | | | 438/239 |
| 2008/0197348 A1* | 8/2008 | Matsubara | ............ | H01L 27/283 |
| | | | | 257/40 |
| 2013/0009218 A1* | 1/2013 | Chen | ............... | H01L 29/7816 |
| | | | | 257/288 |
| 2013/0207101 A1* | 8/2013 | Yamazaki | ......... | H01L 29/41733 |
| | | | | 257/43 |

FOREIGN PATENT DOCUMENTS

| | | |
|---|---|---|
| CN | 101354505 A | 1/2009 |
| CN | 203288601 U | 11/2013 |

OTHER PUBLICATIONS

First Office Action regarding Chinese application No. 201410606296.1, dated Aug. 25, 2016. Translation provided by Dragon Intellectual Property Law Firm.

\* cited by examiner

THIN FILM TRANSISTOR, DISPLAY PANEL AND DISPLAY APPARATUS

CROSS-REFERENCE TO RELATED APPLICATION

The present application claims the priority of Chinese patent application No. 201410606296.1 filed on Oct. 27, 2014, the disclosure of which is incorporated herein by reference.

TECHNICAL FIELD

The present disclosure relates to the field of field effect transistors, in particular to a thin film transistor, a display panel and a display apparatus.

BACKGROUND

A thin film transistor liquid crystal display (TFT-LCD) device has characteristics of fast response, high contrast, high color fidelity and so forth, and occupies the majority of the LCD market.

As shown in FIG. 1, a display panel of the TFT-LCD includes a plurality of gate lines 11 and a plurality of data lines 12, and a plurality of display units defined by the gate lines 11 and the data lines 12. Each of the display units is provided with a thin film transistor (TFT) 20 and a pixel electrode 13. A display principle of the TFT-LCD is as follows: the gate lines 11 and the data lines 12 control ON/OFF states of each TFT 20 and an image signal is written into a corresponding pixel electrode 13 so as to achieve the display. In the practical application, in order to ensure the image signal to be written into the pixel electrode of the display unit instantly and accurately, an on-state current of the TFT needs to be large; and in order to increase brightness of the displayed image, an aperture ratio of the display unit needs to be large. Both the on-state current and the aperture ratio of the display unit are affected by a width to length ratio of a channel of the TFT.

A general structure of the TFT 20 is shown in FIG. 2, which includes a gate electrode 21, a source electrode 22 and a drain electrode 23. A width W of the channel of the TFT is a total length of surfaces where the source electrode 22 and the drain electrode 23 face to each other. A length L of the channel of the TFT is a distance between the source electrode 22 and the drain electrode 23. Another structure of the TFT 20 is shown in FIG. 3, wherein the source electrode 22 is of a U shape, the drain electrode 23 is of a rectangular shape. In such structure, the length L of the channel of the TFT remains the same, and the width of the channel of the TFT is W=W1+W2+W3.

Specifically, a calculation formula of the on-state current is as follows: $Ion=\frac{1}{2} \mu CW/L(Vg-Vt)^2$, where Ion is the on-state current, $\mu$ is a carrier mobility, C is a capacitance of the gate electrode of the TFT, W is the width of the channel of the TFT, L is the length of the channel of the TFT, Vg is a positive voltage of the gate electrode of the TFT, and Vt is a threshold voltage of the TFT. As can be seen from the formula, the on-state current will be increased along with the increase of the width and length ratio W/L of the channel of the TFT in the case that other parameters remain unchanged. In addition, since it is difficult to make the length L of the channel of the TFT to be very small due to the limitation of lithography accuracy, increasing the width W of the channel of the TFT has become an important method to increase the on-state current. However, the width W of the channel of the TFT cannot be increased unlimitedly, because along with the increase of the width W, an area of the TFT is increased, which will cause the aperture ratio of the display unit to be decreased and then the display brightness to be decreased, wherein the aperture ratio of the display unit is equal to a ratio of an area of a light transmission region to that of the display unit, the light transmission region is a region of the display unit other than a non-transparent region such as the TFTs.

SUMMARY

An object of the present disclosure is to provide a thin film transistor (TFT) which has a large width to length ratio, thereby to improve the on-state current.

In order to achieve the above object, the following technical solutions are provided in embodiments of the present disclosure.

The present disclosure provides in an embodiment a thin film transistor (TFT), including a gate electrode, a source electrode and a drain electrode. The source electrode includes a loop structure with an opening, and a width of the opening is less than a maximum width of an inner ring of the loop structure of the source electrode in a direction identical to a direction of the width of the opening. The drain electrode is surrounded by the loop structure, and is not in contact with the source electrode. The drain electrode is distant from the inner ring of the loop structure of the source electrode at a same interval.

The present disclosure further provides in an embodiment a display panel, including the above thin film transistor (TFT).

The present disclosure further provides in an embodiment a display apparatus, including the above display panel.

In the TFT provided by embodiments of the present disclosure, the source electrode is arranged to be a loop structure with an opening, and a width of the opening is less than a maximum width of an inner ring of the loop structure of the source electrode in a direction identical to a direction of the width of the opening. The drain electrode is distant from the inner ring of the loop structure of the source electrode at a same interval and surrounded by the loop structure. As a result, areas of surfaces where the source electrode and the drain electrode face to each are increased so that the width of the channel of the TFT becomes larger. Therefore, in a case that the length of the channel is a constant, the width to length ratio of the channel of the TFT is increased and the on-state current is increased.

BRIEF DESCRIPTION OF THE DRAWINGS

In order to more clearly illustrate the technical solutions according to the embodiments of the present disclosure or the related art, accompany drawings acquired to use in the description of the embodiments will be described briefly below. It is obvious that, the described drawings are merely parts of embodiments of the present disclosure, and other drawings can also be obtained according to these drawings for a person skilled in the art without creative work.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Figure 4:
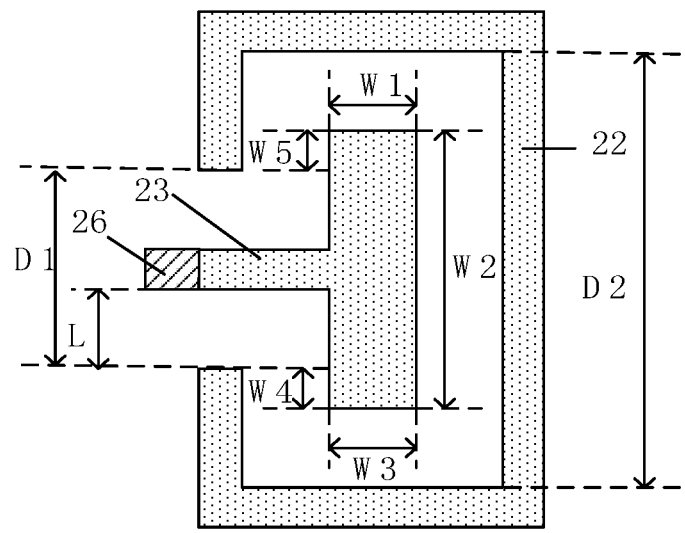
FIG. 4 is a schematic diagram showing a structure of a thin film transistor according to an embodiment of the present disclosure.
Figure 5:
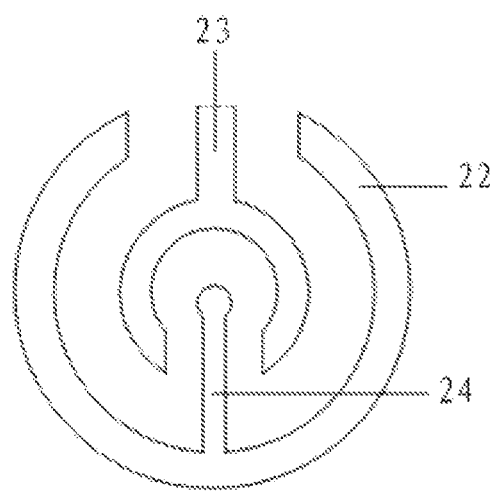
FIG. 5 is a schematic diagram showing another structure of a thin film transistor according to an embodiment of the present disclosure.

The present disclosure provides in an embodiment a thin film transistor (TFT) as shown in FIGS. 4-5, which includes a gate electrode 21, a source electrode 22 and a drain electrode 23. The source electrode 22 includes a loop structure with an opening; a width D1 of the opening is less than a maximum width D2 of an inner ring of the loop structure of the source electrode 22 in a direction identical to a direction of the width of the opening. The drain electrode 23 is surrounded by the loop structure, and not in contact with the source electrode 22. The drain electrode 23 is distant from the inner ring of the loop structure of the source electrode 22 at a same interval.

In the above TFT, the loop structure having the opening may be a loop structure of an arbitrary shape. For example, the loop structure may be a rectangular loop structure as shown in FIG. 4, or a round loop structure as shown in FIG. 5, as long as it is satisfied that the width of the opening is less than a maximum width of an inner ring of the loop structure in a direction identical to a direction of the width of the opening. Therefore, the specific shape is not limited herein.

The above source electrode, drain electrode and gate electrode are three electrodes of a TFT. TFTs can be divided into two types according to a position relationship of the electrodes, one is called a bottom-gate TFT in which the gate electrode is positioned below the source electrode and the drain electrode, the other one is called a top-gate TFT in which the gate electrode is positioned above the source electrode and the drain electrode. In embodiments of the present disclosure, the TFT may be of a bottom-gate type or a top-gate type, which is not limited herein.

It should be noted that, a shape of the drain electrode may be a shape scaled down from that of the inner ring of the loop structure of the source electrode, or other shapes, which is not limited herein, as long as the drain electrode is distant from the inner ring of the loop structure of the source electrode at a same interval. In addition, the drain electrode may further be connected to other electrodes electrically, which is not limited herein. Specifically, as shown in FIG. 4, the drain electrode 23 is connected to a connection electrode 26 electrically.

It should be also noted that, the source electrode and the drain electrode are definitions made relatively to each other, and can be exchanged, which is not limited herein. For example, as shown in FIG. 4, a T-shaped electrode may be defined as the source electrode, and then the electrode with the opening may be defined as the drain electrode. In embodiments of the present disclosure and the accompanying drawings, descriptions are given with an example where the electrode with the opening is called the source electrode and the electrode being surrounded is called the drain electrode.

In the TFT provided by embodiments of the present disclosure, the source electrode is designed to be a loop structure with an opening, and a width of the opening is less than a maximum width of an inner ring of the loop structure of the source electrode in a direction identical to a direction of the width of the opening. The drain electrode is distant from the inner side of the loop structure of the source electrode at a same interval and surrounded by the loop structure. As a result, areas of surfaces where the source electrode and the drain electrode face to each are increased so that the width of the channel of the TFT becomes larger. Therefore, in a case that the length of the channel is a constant, the width to length ratio of the channel of the TFT can be increased and the on-state current is increased.

Further, under the constraint of process conditions, a minimum width of the opening is three times of a resolution of an exposure machine used for manufacturing the TFT. Therefore, if the width of the opening is smaller than the minimum width, then it is difficult for the exposure machine to distinguish between a to-be-exposed region and a to-be-unexposed region, thereby resulting in poor products. The minimum width of the opening is related to the exposure machine actually used, therefore, a specific numerical value of the minimum width is not limited herein.

Figure 1:
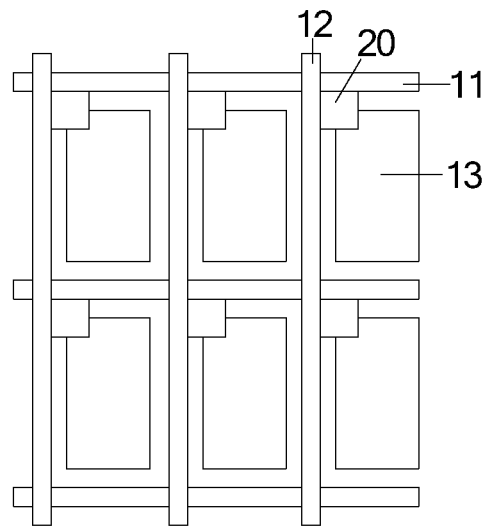
FIG. 1 is a schematic diagram showing a structure of a TFT-LCD display panel in the prior art.
Figure 2:
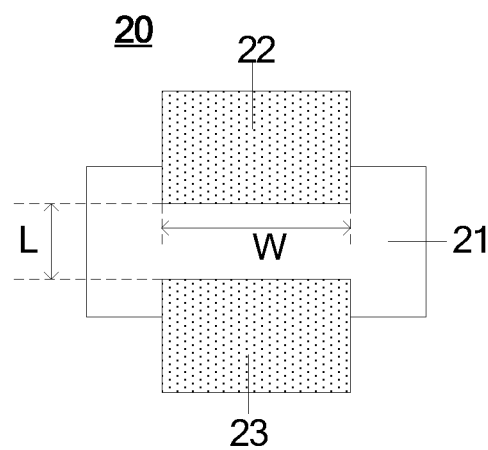
FIG. 2 is a schematic diagram showing a structure of a thin film transistor in the prior art.
Figure 3:
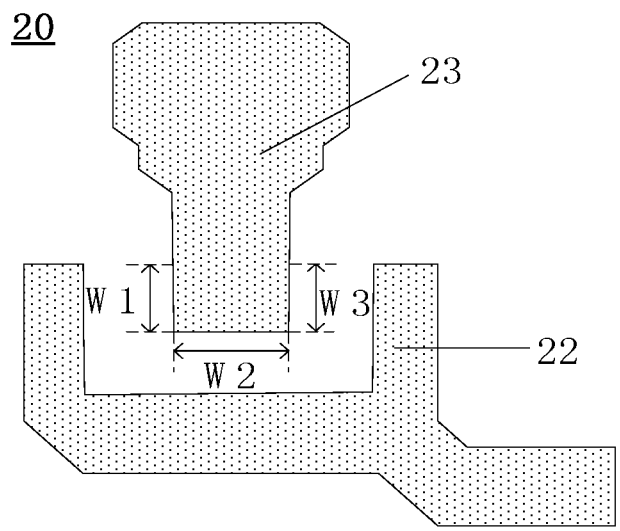
FIG. 3 is a schematic diagram showing another structure of a thin film transistor in the prior art.

Alternatively, as shown in FIG. 4, the source electrode 22 is of a rectangular loop structure with an opening. In this case, the width of the channel of the TFT is W=W1+W2+W3+W4+W5. In a case of remaining the same area, the width to length ratio of the channel of the TFT in FIG. 4 is greater than that of the TFT in FIGS. 2 and 3, and thus to provide a larger on-state current.

Alternatively, as shown in FIG. 5, the source electrode 22 is of a round loop structure with an opening. Further, the source electrode 22 further includes a projecting portion 24 arranged inside the round loop structure and connected to the round loop structure. The projecting portion 24 facilitates to further increase areas of surfaces where the source electrode 22 and the drain electrode 23 of the TFT face to each other, thereby increasing the width to length ratio of the channel of the TFT and the on-state current of the TFT.

Further, in order to reduce the manufacture difficulty, the shape of the drain electrode may be a shape scaled down from that of the inner ring of the loop structure of the source electrode.

Figure 6:
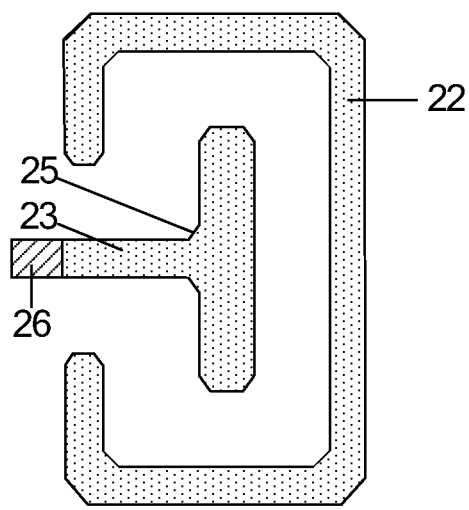
FIG. 6 is a schematic diagram showing an improved structure of the thin film transistor in FIG. 4.

Alternatively, in order to prevent charges from accumulating at corners of the drain electrode and the source electrode to form static electricity, corners of both source electrode and the drain electrode may be designed as an obtuse angle. Specifically, taking FIG. 4 as an example, right angle regions of the source electrode 22 and the drain electrode 23 in FIG. 4 may be designed to be inclined planes 25 shown in FIG. 6.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A thin film transistor (TFT), comprising a gate electrode, a source electrode and a drain electrode, wherein the source electrode comprises a first round loop structure with a first gap, a width of the first gap is less than a maximum width of an inner ring of the first round loop structure of the source electrode in a direction identical to a direction of the width of the first gap;

the drain electrode comprises a second round loop structure with a second gap, the drain electrode is surrounded by the first round loop structure and is not in contact with the source electrode; and the drain electrode is distant from the inner ring of the first round loop structure of the source electrode at a constant interval, wherein the source electrode further comprises a first projecting portion arranged inside the first round loop structure and connected to the first round loop structure and the drain electrode further comprises a second projecting portion arranged outside the second round loop structure and connected to the second round loop structure, wherein the center points of the second gap and the first gap, respectively.

2. A display panel, comprising the thin film transistor (TFT) according to claim 1.

3. A display apparatus, comprising the display panel according to claim 2.

4. The TFT according to claim 1, wherein the first projecting portion is in the middle of the second gap.

5. The TFT according to claim 1, wherein the second projecting portion is in the middle of the first gap.

6. The TFT according to claim 1, wherein a width of the second gap is less than a maximum width of an inner ring of the second round loop structure of the drain electrode in a direction identical to a direction of the width of the second gap.

7. The TFT according to claim 1, wherein the first projecting portion and the second projecting portion are not extended beyond the first round loop structure.

* * * * *